US 11,300,530 B2

United States Patent
Goran (10) Patent No.: US 11,300,530 B2
(45) Date of Patent: Apr. 12, 2022

(54) KIKUCHI DIFFRACTION DETECTOR

(71) Applicant: BRUKER NANO GMBH, Berlin (DE)

(72) Inventor: Daniel Radu Goran, Berlin (DE)

(73) Assignee: BRUKER NANO GMBH, Berlin (DE)

( * ) Notice: Subject to any disclaimer, the term of this patent is extended or adjusted under 35 U.S.C. 154(b) by 40 days.

(21) Appl. No.: 16/935,620

(22) Filed: Jul. 22, 2020

(65) Prior Publication Data
US 2021/0025837 A1    Jan. 28, 2021

(30) Foreign Application Priority Data

Jul. 26, 2019 (EP) ................................. 19188579

(51) Int. Cl.
*G01N 23/207* (2018.01)
*G01T 1/20* (2006.01)
(Continued)

(52) U.S. Cl.
CPC ......... *G01N 23/207* (2013.01); *G01T 1/2006* (2013.01); *H01J 37/244* (2013.01);
(Continued)

(58) Field of Classification Search
CPC ......... G01N 23/207; G01N 2223/0565; G01N 2223/505; G01N 23/2055; G01N 23/2251; G01N 23/203; G01N 23/04; G01N 23/20058; G01N 23/2206; G01N 2223/03; G01N 2223/045; G01N 2223/053; G01N 2223/071; G01T 1/2006; H01J 37/244; H01J 37/28; H01J 37/256; H01J 37/2955
See application file for complete search history.

(56) References Cited

U.S. PATENT DOCUMENTS 5,517,033 A    5/1996  Krivanek et al.
7,442,930 B2 * 10/2008 Chou .................. G01N 23/203
                                                        250/307
(Continued)

FOREIGN PATENT DOCUMENTS

WO    2013/192608 A1    12/2013
WO    2015/121603 A1     8/2015
WO    2019/064013 A1     4/2019

OTHER PUBLICATIONS

Garmestani et al., "Orientation Determination by EBSP in an Environmental Scanning Electron Microscope", Scripta Materialia, Elsevier, Amsterdam, NL, Vo. 41, No. 1, pp. 47-53, Jun. 1999.
(Continued)

*Primary Examiner* — David A Vanore
(74) *Attorney, Agent, or Firm* — Norris McLaughlin, P.A.

(57) ABSTRACT

A detector for Kikuchi diffraction comprising a detector body and a detector head mountable to each other. The detector body comprises a body part which is enclosing a photodetector configured for detecting incident radiation and further comprises a vacuum window arranged upstream the photodetector with respect to a propagation direction of the incident radiation, a first body mounting portion configured to be mounted to a SEM chamber port and a second body mounting portion. The detector head comprises a scintillation screen and a head mounting portion configured to be mounted to the second body mounting portion.

14 Claims, 5 Drawing Sheets

(51) Int. Cl.
*H01J 37/244* (2006.01)
*H01J 37/28* (2006.01)
(52) U.S. Cl.
CPC ...... *H01J 37/28* (2013.01); *G01N 2223/0565* (2013.01); *G01N 2223/505* (2013.01)

(56) References Cited

U.S. PATENT DOCUMENTS

| | | | |
|---|---|---|---|
| 2003/0057377 A1* | 3/2003 | Gilmore | H01J 37/244 250/397 |
| 2018/0010909 A1* | 1/2018 | Winkelmann | G01N 23/203 |
| 2018/0166253 A1 | 6/2018 | Pesic et al. | |
| 2020/0135426 A1* | 4/2020 | Goran | H01J 37/20 |
| 2021/0025837 A1* | 1/2021 | Goran | H01J 37/256 |
| 2021/0183612 A1* | 6/2021 | Schwager | G01N 23/20058 |

OTHER PUBLICATIONS

Mingard et al., "Towards High Accuracy Calibration of Electron Backscatter Diffraction Systems", Ultramicroscopy, Elsevier, Amsterdam, NL, vol. 111, No. 5, pp. 320-329, Jan. 2011.
Translation of Extended European Search Report dated Feb. 14, 2020, in connection with European Application No. 19188579.7.

* cited by examiner

KIKUCHI DIFFRACTION DETECTOR

This application claims foreign priority benefit under 35 U.S.C. § 119 of European Patent Application No. 19188579.7, filed Jul. 26, 2019, the disclosure of which is incorporated herein by reference.

FIELD OF THE INVENTION

The invention relates to a detector for Kikuchi diffraction, KD, particularly to a compact, lightweight and low-cost KD detector for use with compact SEMs, such as table top SEMs.

TECHNOLOGICAL BACKGROUND

The structure of crystalline materials can be analyzed using diffraction methods, wherein suitable electromagnetic waves are coherently scattered by the atoms of the material. The direction-dependent intensity of the scattered radiation is then recorded at different scattering angles. Various information on the crystalline material, such as on the crystal structure, chemical bonds or mechanical strain within the sample, can be derived from the recorded angle-dependent intensity distribution of the diffracted waves of the applied radiation.

Suitable radiation can either be electromagnetic radiation, such as X-rays, or massive particle radiation, such as electron or neutron beams, as long as the wavelength of the radiation is within the magnitude of the lattice constant(s) of the structure(s) to be analyzed. While X-ray crystallography still is one of the most widely used techniques in global structure analysis, more methods utilizing electron beams for resolving crystal structures are developed and at least some of these methods can be functionally integrated in SEMs.

The most common analytic technique integrated in SEMs probably still is energy dispersive spectroscopy, EDS, also called EDX, which allows for characterizing the elemental composition of a sample based on characteristic X-rays emitted by the sample after being excited by an incident electron beam. Another analytic technique for measuring crystal orientation that becomes more commonly integrated into electron microscopes is Kikuchi diffraction. This technique can be implemented as electron backscatter diffraction (EBSD), which is also known as backscatter Kikuchi diffraction (BKD), or as transmission Kikuchi diffraction (TKD), also known as transmission electron backscatter diffraction (t-EBSD).

In Kikuchi diffraction, a crystalline sample is placed in a scanning electron microscope (SEM) and irradiated with a focused electron beam. At least part of the electrons are scattered within the sample and then exit it with an angle-dependent intensity distribution. Using a two-dimensional detector, Kikuchi patterns can be recorded in a gnomonic projection on the detector surface and can be analyzed with respect to the crystal orientation and structure of the crystalline sample. In EBSD, the backscatter electrons are detected upstream the sample with respect to a propagation direction of the initially incident electron beam, whereas in TKD transmitted and diffracted electrons are detected downstream the sample in this direction.

Currently used Kikuchi detectors are rather complex and thus require significant mounting space inside and outside the vacuum chamber of an electron microscope. Above that the currently available highly specialized Kikuchi detectors are rather directed to the highest possible versatility and precision and rather not to providing a cost-effective tool for widespread use in different kinds of SEMs.

However, nowadays a majority of electron microscopes is formed by low end or low cost microscopes with a small footprint, such as e.g., table top and compact SEMs. These low-end microscopes usually have a rather compact vacuum chamber, which complicates or even excludes mounting a currently available Kikuchi detector due to size and weight reasons. Further, the price of those low end SEMs is in the same range as the price of the currently available Kikuchi detectors. The technical and commercial feasibility of currently available Kikuchi detectors is thus limited to high end SEMs.

It is thus an object of the present invention to overcome or at least reduce the disadvantages of the prior art and to provide simple, low cost and compact Kikuchi detector that can be applied to a wide range of electron microscopes and expands the use of Kikuchi diffraction.

SUMMARY OF INVENTION

The objective of the invention is solved and the disadvantages of the prior art are overcome by the subject-matter of the present invention, i.e. a detector for Kikuchi diffraction of claim 1.

An aspect of the present invention relates to a detector for Kikuchi diffraction, particularly for electron backscatter diffraction, EBSD, or for transmission Kikuchi diffraction, TKD. The detector of the present invention shall be in principle usable for both of these measurement configurations, which differ mainly by the positioning of the detector surface relative to the sample position. Without being restricted thereto, in the following the detector of the invention is described with respect to EBSD where it is necessary or appropriate to specify this.

The detector of the present invention comprises a detector body and a detector head, which are mountable to each other. In other words, the detector body and the detector head can be selectively mounted (connected) to each other, i.e., a detachable connection can be formed between the detector body and the detector head. The respective features of the detector body and detector head for realizing such detachable connection are described in the following. In other words, the detector of the present invention has a modular structure.

According to the present invention, the detector body comprises a body part which is enclosing a photodetector that is configured for detecting incident radiation. The body part forms the main body of the detector body and preferably comprises a housing. Within this housing further components of the detector next to the photodetector might be disposed, particularly control electronics and/or means for cooling the detector. The photodetector disposed in the body part, preferably the housing thereof, may be one of a CCD or CMOS photodetector. The photodetector comprises at least an active detector surface, e.g., a silicon detector surface, and readout electronics electrically connected to the active detector surface. The photodetector is particularly configured to detect Kikuchi pattern and comprises e.g., a size, resolution and/or sensitivity that is suitable for detecting Kikuchi patterns.

The body part further comprises a vacuum window that is arranged upstream the photodetector with respect to a propagation direction of the incident radiation. The vacuum window is configured to seal the body part, particularly the housing with the detector components disposed therein against an exterior environment. In a mounted state of the detector body this exterior environment is a SEM chamber as described below. The vacuum window is thus configured to seal the body part from the vacuum in a SEM chamber and vice versa. Further, the vacuum window is, at least substantially, transparent and configured to allow the transmittance of incident photons emitted by a scintillation screen of the detector.

According to the present invention, the detector body further comprises a first body mounting portion and a second body mounting portion. Therein, the first body mounting portion is configured to be mounted to a SEM chamber port of a SEM. Common SEMs comprise at least one chamber port for mounting electron microscope accessory, such as detectors, cameras, sample preparation means or the like. The geometry and fastening systems of those SEM chamber ports are usually standardized, at least for a given manufacturer. Hence, for a given electron microscope, the first body mounting portion has a defined configuration. For the skilled person it is a standard task to determine the configuration of the first body mounting portion with respect to a certain SEM and a required mounting quality.

Usually, a SEM chamber port comprises at least one mounting flange, such as e.g., a circular mounting flange, e.g., circumcising a mounting aperture in an outer wall of the SEM.

The mounting flange may further comprise sealing means, such as e.g., mounting grooves for inserting vacuum seals. However, also flat vacuum gaskets might be used with the mounting flange. Further, the mounting flange usually comprises mounting means, such as e.g., screw holes within the mounting flange. However, other fastening means providing a form and/or force closure between the mounting flange and a mounted component might be used. The mounting flange of the chamber port might be external or internal of the SEM outer wall. Exemplarily, a microscope accessory might also be inserted into an opening of an SEM outer wall and secured therein by a bayonet fastening mechanism and sealing means.

According to the present invention, the first body mounting portion is configured to be mounted to such a SEM chamber port of a SEM. In a preferred embodiment, the first body mounting portion comprises a first mounting flange that is configured to be mounted to a mounting flange of a SEM chamber port. In particular, the size of the first mounting flange may be adapted to the size of the mounting flange. Further preferred, the positioning of bores, screw holes and/or mounting structures for sealing means (e.g., sealing grooves) may be adapted to the positioning of the corresponding elements on the SEM mounting flange.

The detector body of the detector of the present invention further comprises a second body mounting portion that is configured to be mounted to the detector head. In other words, the second body mounting portion realizes the detachable connection mentioned above on side of the detector body. The second body mounting portion is thus one part of a connecting mechanism between the detector body and the detector head realizing the modular structure.

The detector head of the detector of the present invention comprises a head mounting portion that is configured to be mounted to the second body mounting portion. In other words, the head mounting portion is configured as a counterpart for the second body mounting portion, such that the configurations of both of these elements depend on each other. The head mounting portion is mountable to the second body mounting portion for mounting the detector head to the detector body. In other words, the detachable connection between the head mounting portion and the second body mounting portion realizes the detachable connection between the detector head and the detector body. The detachable connection between the head mounting portion and the second body mounting portion is preferably configured to provide a vacuum sealed connection. Therefore, these connection elements are preferably configured to insert sealing means, such as e.g., gaskets therein.

The detector head of the present invention further comprises a scintillation screen, i.e., a structure that converts incident scattered electrons into electromagnetic radiation, i.e., photons. Exemplarily, the scintillation screen might comprise a phosphor layer configured to emit photons in response to incident backscattered electrons. In Kikuchi diffraction, the scintillation screen is positioned near the sample either upstream (EBSD) or downstream (TKD) with respect to the incident electron beam. The scintillation screen is preferably configured to convert the expected dose of incident (back)-scattered electrons into electromagnetic radiation with an intensity and/or a preferred direction of emittance that allows to detect this electromagnetic radiation with a high quantum yield at the photodetector.

The Kikuchi detector of the present invention can be advantageously used for low end SEMs, particularly with small SEMs comprising a compact SEM chamber. This is achieved by providing a Kikuchi detector with a modular structure as described above. Particularly preferred, this structure allows to permanently mount the detector body to the SEM via the first body mounting portion. Then, the detector head can be selectively mounted to the second body mounting portion into to the SEM chamber. That is, in case the Kikuchi detector is not required, the detector head can be removed for freeing space in the SEM chamber. Further, the modular structure simplifies maintenance of the Kikuchi detector, e.g., by selectively replacing or maintaining components in the detector body, such as e.g., the photodetector, or components in the detector head, such as e.g., the scintillation screen.

In a preferred embodiment of the present invention, the first body mounting portion is disposed in between the second mounting portion and the photodetector. In other words, along an extension direction of the detector body, the first body mounting portion follows on the photodetector and then the second body mounting portion follows on the first body mounting portion. Therein, the extension direction of the detector body preferably corresponds to a propagation direction of incident radiation, particularly preferred the radiation emitted by the scintillation screen in response to the incident scattered electrons.

In other words, the second body mounting portion extends upstream the first body mounting portion with respect to the propagation direction of the incident radiation emitted by the scintillation screen. Put differently, the first body mounting portion is disposed between the body part and the second body mounting portion and hence the second body mounting portion preferably forms an outermost (or terminal end) of the detector body. In a lateral direction, i.e., a direction perpendicular the propagation direction of incident radiation (extension direction), the first body mounting portion preferably extends over the second body mounting portion. In other words, a width of the first body mounting portion exceeds the width of the second body mounting portion in order to allow sealing the SEM chamber port.

Particularly preferred, the second body mounting portion is configured to be inserted through the SEM chamber port, before the first body mounting portion is mounted to an outer side of the SEM chamber port. In other words, in order to mount the first body mounting portion to the SEM chamber port, the second body mounting portion has to be inserted into the SEM chamber or at least through the SEM chamber port, depending on a wall thickness of the SEM. Hence, the lateral extension of the second body mounting portion is less than the lateral extension of the first body mounting portion in order to allow the insertion through the SEM chamber port. The second body mounting portion preferably has an extension, e.g., along the propagation direction of the incident radiation, which extends the thickness of the SEM outer wall such that the second body mounting portion extends into the SEM chamber.

Hence, when the first body mounting portion is mounted to the SEM chamber port, the body part of the detector according to the present invention is disposed outside the SEM chamber, particularly outside the SEM, and the second body mounting portion is disposed inside the SEM chamber and is accessible from inside the SEM chamber. Thus, the detector head, particularly the head mounting portion, can be mounted to the detector body, particularly the second body mounting portion thereof, from within the SEM chamber. Hence, the head mounting portion is configured to be mounted to the second body mounting portion, while the second body mounting portion is inserted through the SEM chamber port, and from an inner side of a SEM chamber. That is, the detector body of the detector according to the invention does not have to be removed from the SEM chamber port for mounting the detector head. This increases the versatility of the SEM for a user as the SEM chamber can be freed when Kikuchi measurements are not required by a user, while the detector body stays mounted.

Further preferred, the detector head comprises a hollow column, particularly preferred a hollow steel column. The hollow column preferably is of a cylindrical shape such as e.g., of a circular cylindrical shape. However, other shapes are possible as long as they allow for transmission of radiation along the already mentioned propagation (extension) direction. According to this embodiment, the head mounting portion is disposed at a first end of the hollow column, i.e., at one terminal end of the hollow column with which the column is mounted to the second body mounting portion of the detector body. Further preferred, the scintillation screen is mounted to a second end of the hollow column opposite the first end.

According to this embodiment, electrons incident on the detector head near the second end generate photons at the scintillation screen and these photons travel through the hollow column towards the first end, where they enter the detector body via the vacuum window. The photons also pass through the body mounting portions of the detector body, which thus both comprises a central aperture for allowing the photons to pass to the photodetector. Particularly, the central apertures of the body mounting portions are aligned with each other, further preferred also with the vacuum window and the photodetector along the propagation direction of the incident radiation, i.e., the extension direction of the detector of the invention.

In a preferred embodiment, the length of the hollow column corresponds to a distance between the side of the SEM chamber port facing the SEM chamber and a sample position. Therein, the sample position is the position of a sample in the SEM chamber during a measurement of Kikuchi patterns. The sample position is preferably determined by a sample stage or sample holder mounted within the SEM chamber. According to this embodiment, the scintillation screen is preferably positioned adjacent the sample position of the SEM chamber, when the first body mounting portion is mounted to the SEM chamber port and when the head mounting portion is mounted to the second body mounting portion. Hence, a rather high fraction of electrons scattered by the sample can hit the scintillation screen and generate photons in the scintillation screen which can then be detected by the photodetector. The length of the hollow column preferably corresponds to a distance between the side of the SEM chamber port facing the SEM chamber and a sample position so that the scintillation screen receives an optimal yield and distribution of the radiation produced by the sample.

In a preferred embodiment of the present invention, the scintillation screen is mounted to a screen holder which again is mounted to the hollow column of the detector head, particularly to the second end of the hollow column. In other words, in this embodiment the detector head comprises a screen holder which is connectable to the hollow column, e.g., the second end thereof, and which is carrying the scintillation screen. This embodiment advantageously allows an easy replacement of the scintillation screen by replacing the screen holder. Further, the screen holder and the hollow column can be stored separately, which more easily allows for an adequate storage of the very sensitive scintillation screen. In this embodiment, preferably the length of the hollow column with the screen holder mounted thereto corresponds to the distance between the SEM chamber port and the sample position.

In a preferred embodiment of the detector, the head mounting portion comprises at least one flange element and the second body mounting portion comprises at least one reception element configured for guiding, receiving and/or fastening the at least one flange element. Preferably, the head mounting portion comprises multiple flange elements, wherein the flange elements are formed by portions of one single flange and/or the flange elements are formed by individual flanges, e.g., extending in the lateral extension defined above. The reception elements are preferably configured for guiding the flange elements, respectively.

Exemplarily the reception elements each comprise at least one groove (slot) for receiving a flange element. Particularly preferred, the second body mounting portion comprises L-shaped reception elements forming a groove with a flange surface of the second body mounting portion. Then, the flange elements are slid into the groove parallelly to the flange surface, i.e., along the lateral direction of the detector, e.g. perpendicular to the extension direction. Further preferred, the L-shaped reception elements are fixed to the second body mounting portion with permanently mounted screws. By tightening those screws, the flange elements are then secured by the L-shaped reception elements. According to this embodiment, the detector head can be advantageously mounted to the detector body without inserting additional loose screws into the SEM chamber by simply sliding the head mounting portion of the detector head in the second body mounting portion of the detector body.

Above that, the head mounting portion and/or the second body mounting portion further comprises alignment means for supporting a proper alignment of the head mounting portion and the second body mounting portion. The alignment means might comprise spring loaded balls as well as corresponding circular reception apertures, wherein the spring-loaded balls are disposed in the reception apertures, when the detector head is aligned with the detector body. Additionally or alternatively, one of the detector head and detector body comprises at least one defined end-stop element, providing an end-stop in an alignment position of detector head and detector body. Particularly preferred, such an end-stop is provided by an additional L-shaped element oriented perpendicular to the above mentioned sliding direction.

In the detector of the present invention, the optical system can be distributed to the detector body and the detector head. As already described, the photodetector is disposed in the detector body while the scintillation screen is disposed in the detector head. Further preferred, an objective lens is disposed in the detector body, particularly between the vacuum window and the photodetector of the detector body. Particularly preferred, the objective lens is disposed adjacent to the photodetector. This allows for precisely setting the properties of imaging the incident radiation onto the active surface of the photodetector.

According to an alternatively preferred embodiment, the detector body, particularly preferred the body part of the detector, comprises a fiber optical taper that is positioned upstream the photodetector with respect to the propagation direction of the incident radiation. The fiber optical taper is preferably formed by a coherent arrangement of fibers that are arranged in a surface-to-surface arrangement forming a first base surface and a smaller second base surface. Therein, the first base surface is facing the detector head and an image signal input to the first base surface is transmitted as a reduced image to the second base surface facing the active surface of the photodetector. Therein, the reduction is defined by a ratio of the first and second base surface. Further preferred, the upstream end of the fiber optical taper constitutes the vacuum window and an additional vacuum window can thus be omitted.

Additionally or alternatively, the detector head further comprises a field lens that is arranged adjacent the scintillation screen in the propagation direction of the incident radiation. The field lens preferably has a high numerical aperture and allows for capturing a high fraction of the light emitted by the scintillation screen as well as for focusing it on the remaining optical system. Therein, a planar side of the field lens is facing the scintillation screen and the convexly curved side of the field lens is facing away from the scintillation screen. With this embodiment the light efficiency of the detector is maximized, which is advantageous as the detector of the invention is designed to be also used with low end SEMs having less intense electron beams that are thus prone to provide less intense Kikuchi signals on the detector.

In a preferred embodiment of the invention, the detector further comprises a macro lens that is arranged in the detector body adjacent the vacuum window with respect to the propagation direction of the incident radiation. Alternatively or additionally the detector comprises a macro lens that is arranged in the detector head adjacent the scintillation screen with respect to the propagation direction of the incident radiation. Preferably, the macro lens has a short focal length and thus allows for minimizing the extension of the detector, particularly along the propagation direction of the incident radiation, i.e., along the optical axis of the detector.

Another aspect of the present invention relates to a detector body for a detector according to the present invention as described above. Therein, the detector body of the present invention at least comprises a body part, which encloses at least a photodetector configured for detecting incident radiation, particularly incident electromagnetic radiation emitted by a scintillation screen. The body part preferably further comprises control electronics of the photodetector and/or of the detector as a whole as well as cooling means for cooling the photodetector and/or the detector as a whole. The detector body of the present invention further comprises a vacuum window that is arranged upstream the photodetector with respect to a propagation direction of the incident radiation, particularly with respect to the incident radiation, e.g., emitted by a scintillation screen disposed in the detector head.

The detector body according to the present invention further comprises a first body mounting portion that is configured to be mounted to a SEM chamber port of a SEM. The first body mounting portion preferably comprises a common first mounting flange for mounting a microscope accessory to a SEM via a SEM chamber port. The first body mounting portion might comprise a first mounting flange adapted to a mounting flange of the SEM chamber port. The detector body further comprises a second body mounting portion that is configured to be mounted to a head mounting portion of a detector head as described above.

In a particularly preferred embodiment, the second body mounting portion extends upstream the first body mounting portion with respect to the propagation direction of the incident radiation. Further preferred, the first body mounting portion is disposed in between the second mounting portion and the photodetector and the first body mounting portion extends laterally above the second body mounting portion. Further preferred embodiments of the detector body and components thereof correspond to preferred embodiments as described with respect to the detector of the invention as well as components thereof.

Another aspect of the present invention relates to a detector head for a detector according to the present invention as described above. The detector head of the invention comprises at least a hollow column with a first (terminal) end and with a second (terminal) end that is opposite to the first end. Further, a head mounting portion is disposed at the first end and is configured to be mounted to a second body mounting portion of a detector body. A scintillation screen is mounted to the second end, preferably via a screen holder. Further preferred embodiments of the detector head correspond to those described for the detector.

Another aspect of the present invention relates to a detection system for Kikuchi diffraction, the detection system comprising a scanning electron microscope, SEM, comprising a SEM vacuum chamber and at least one SEM chamber port for accessing the SEM chamber. Naturally, the SEM further comprises an electron source, one or more electron lenses, a sample stage and/or a sample holder, a vacuum system and/or the like. The detection system of the invention further comprises a detector according to the present invention and as described above.

Therein, the first body mounting portion of the detector body is preferably mounted to a SEM chamber port of the SEM such that the second body mounting portion is inserted through the SEM chamber port and extends at least partially into the SEM chamber, when the first body mounting portion is mounted to the SEM chamber port. The detector head is preferably mounted via its head mounting portion to the second body mounting portion and is disposed in the SEM chamber. Hence, Kikuchi pattern measurements can be performed with respect to a sample that is positioned at a sample position adjacent the scintillation screen of the detector head. When measurements are complete, the detector head can be dismounted from the detector body and the SEM chamber is freed in order to perform other measurements.

Further aspects and preferred embodiments of the invention result from the dependent claims, the drawings and the following description of the drawings. Different disclosed embodiments are advantageously combined with each other if not explicitly stated otherwise.

BRIEF DESCRIPTION OF THE DRAWINGS

The features of the invention become apparent to those skilled in the art by the detailed description of exemplary embodiments with reference to the attached drawings in which.

DETAILED DESCRIPTION OF THE INVENTION

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. The present invention, may be embodied in various different forms, and should not be construed as being limited to only the illustrated embodiments herein. These embodiments are provided as examples so that this disclosure will be complete and will fully convey the aspects and features of the present invention to those skilled in the art.

Accordingly, elements not considered necessary to those having skill in the art for a complete understanding of the features of the present invention may not be described.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise.

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention. As used herein, the term "substantially", "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

Figure 1:
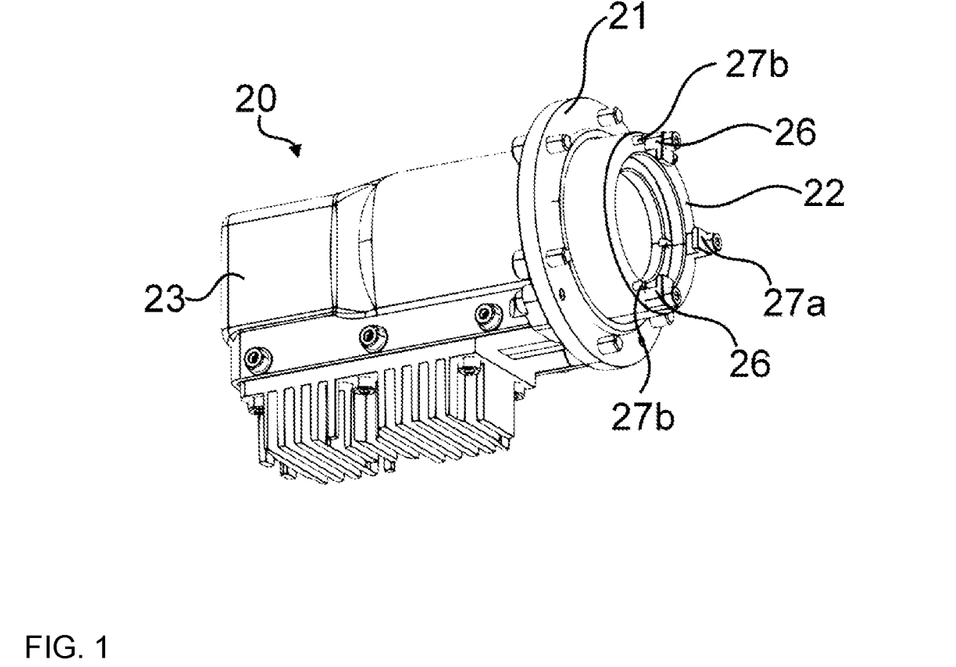
FIG. 1 schematically illustrates a perspective view detector body according to an embodiment.

FIG. 1 schematically illustrates a perspective view detector body 20 according to an embodiment. The detector body 20 as shown in FIG. 1 is designed to be mounted to a detector head 30 as illustrated e.g., in FIG. 5 for forming the detector 10 of the invention.

The detector body 20 of FIG. 1 comprises a body part 23, which is a plastic housing for enclosing a photodetector (not shown) as well as control electronics of the photodetector and the detector 10 as whole. On a lower side of the body part 23 a heat exchanger comprising a plurality of cooling fins is mounted for dissipating heat emitted by the detector body 20.

The detector body 20 comprises a first body mounting portion 21 and a second body mounting portion 22 disposed at a terminal end of the body part 23. Therein, the first body mounting portion 21 is disposed in between the body part 23 and the second body mounting portion 22. The first body mounting portion 21 is configured to be mounted to an SEM chamber port 50. Therefore, the first body mounting portion 21 comprises a first mounting flange extending laterally from the body part 23. A plurality of connection screws sit in the first mounting flange and are configured and positioned to fit into corresponding screw holes of a mounting flange of the SEM chamber port 50. When mounting the detector body 20 to the SEM chamber port 50 a flat vacuum gasket (not shown) with openings corresponding to the screws is positioned between the first mounting flange and the SEM mounting flange.

Figure 2:
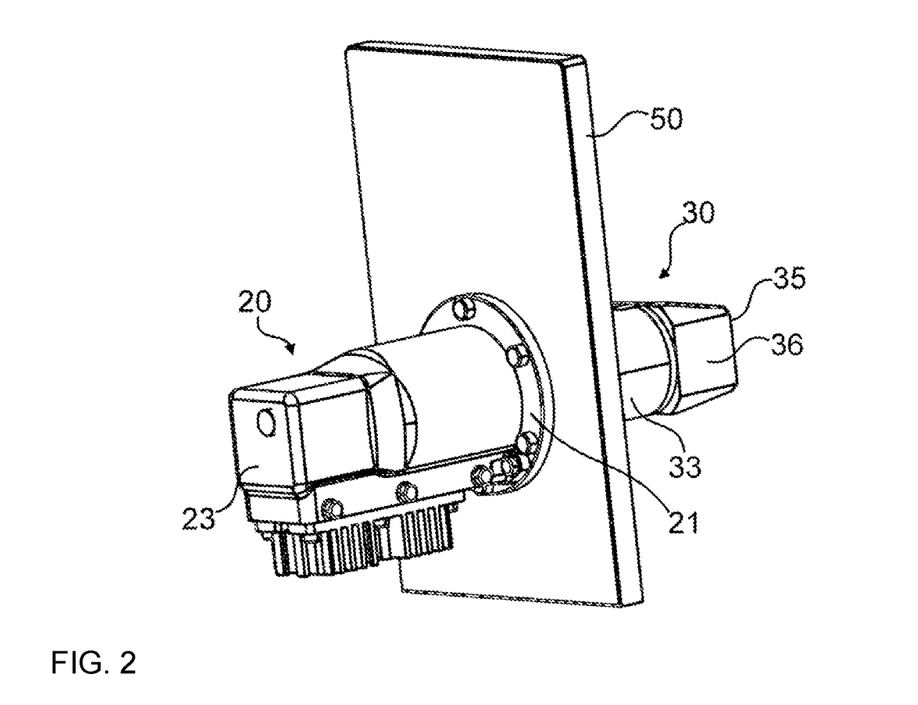
FIG. 2 schematically illustrates an outer perspective view of a detector comprising the detector body of FIG. 1 mounted to an SEM chamber port.

FIG. 2 schematically illustrates an outer perspective view of a detector 10 comprising the detector body 20 of FIG. 1 mounted to an SEM chamber port 50 of a SEM. Therein, the first body mounting portion 21 sits tightly on a mounting flange (not shown) circumferentially surrounding the mounting opening in the SEM chamber port 50. The first body mounting portion 21 is fastened to the SEM chamber port 50 by a plurality of screws and a flat vacuum gasket is provided between the SEM chamber port 50 and the first body mounting portion 21.

As illustrated in FIG. 1, the second body mounting portion 22 extends upstream of the first body mounting portion 21 with respect to a propagation direction of an incident radiation. In other words, the detector body 20 is configured to detect radiation that enters the body part 23 first via a central aperture in the second body mounting portion 22 and subsequently via a central aperture in the first body mounting portion 21. The second body mounting portion 22 is of substantially cylindrical shape and has an extension in the propagation direction which exceeds or at least equals the thickness of a SEM chamber wall. A first base surface of the cylindrical second body mounting portion 22 is connected to the detector body 20, e.g., to the first body mounting portion 21. A second base surface of the cylindrical second body mounting portion 22 opposite the first base surface is facing into the SEM chamber, when the first body mounting portion 21 is mounted to an SEM chamber port 50.

Figure 3:
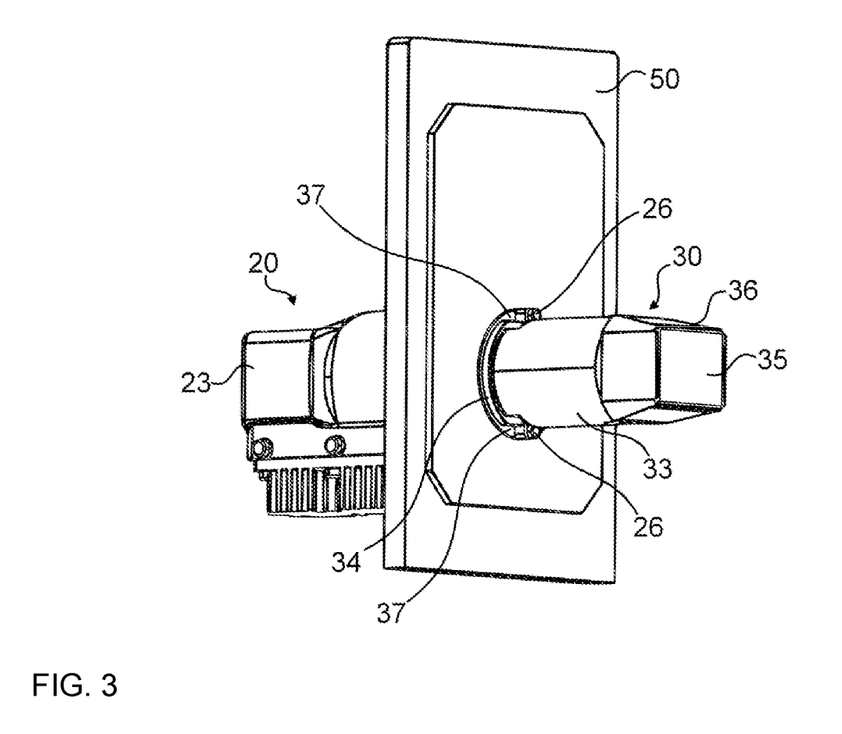
FIG. 3 schematically illustrates an inner perspective view of a detector comprising the detector body of FIG. 1 mounted to an SEM chamber port.

As illustrated in FIG. 3, if the first body mounting portion 21 is mounted to the SEM chamber port 50 as shown in FIG.

2, the second base surface is aligned with an inner surface of the SEM chamber port 50. In other words, the second base surface of the second body mounting portion 22 and the inner surface of the SEM chamber port 50 form a continuous straight and level surface. The second body mounting portion 22 comprises reception elements 26 and alignment elements 27 that both protrude from the second base into the SEM chamber, when the detector body 20 is mounted to the SEM chamber port 50.

Figure 4:
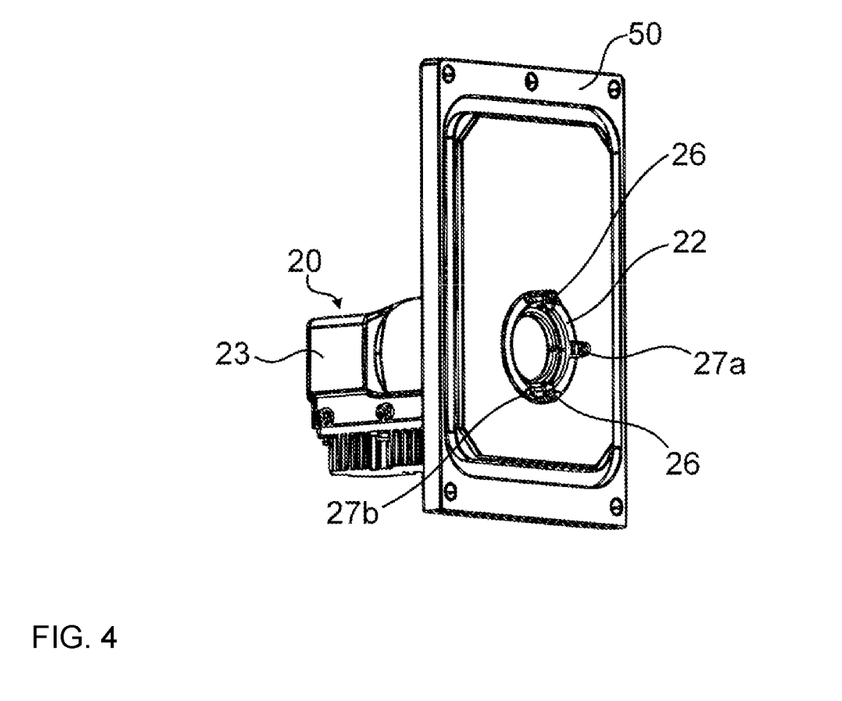
FIG. 4 schematically illustrates an inner perspective view of the detector body of FIG. 1 mounted to an SEM chamber port.

As illustrated in FIGS. 1, 3 and 4, the reception elements 26 are formed by a pair of L-shaped fasteners 26 arranged opposite to each other on the second base surface. Each of the L-shaped fasteners 26 comprise a first leg and a second leg perpendicular to the first leg. The L-shaped fasteners 26 are mounted to the second base surface with their respective first legs such that their respective second legs extend parallelly to the second base surface.

Particularly, the L-shaped fasteners 26 are mounted to the second base surface via screws extending through their respective first legs. Hence, each of the L-shaped fasteners 26 forms a guiding groove between its second leg and the second base surface. Further, the L-shaped fasteners 26 are mounted opposite to each other such that the openings of the guiding grooves are facing each other. The head mounting portion 34 of a detector head 30 as e.g., illustrated in FIG. 5, particularly the flange elements 37 of such head mounting portion 34, can be slid into the guiding grooves of the fasteners 26 for mounting the detector head 30.

The second body mounting portion 22 further comprises alignment means 27 that comprise a third L-shaped fastener 27a that is mounted to the second base surface with an orientation perpendicular to that of the L-shaped fasteners 26 mounted as reception elements 26. Hence, when the flange elements 37 of a head mounting portion 34 of a detector head 30 are slid into the reception elements 26 of the first body mounting portion 21 as illustrated e.g., in FIG. 4, the third L-shaped fastener 27a functions as a defined end-stop for the head mounting portion 34. Further, four alignment pins 27b protrude from the second base surface for guiding the head mounting portion 34 into the guiding grooves of the L-shaped fasteners 27a. When the detector head 30 of FIG. 5 is mounted to the second body mounting portion 22 aligned with the inner surface of the SEM chamber as illustrated in FIG. 3, the scintillation screen 35 mounted to a screen holder 36 is disposed adjacent to a sample position in the SEM chamber in order to detect a large portion of scattered electrons.

Figure 5:
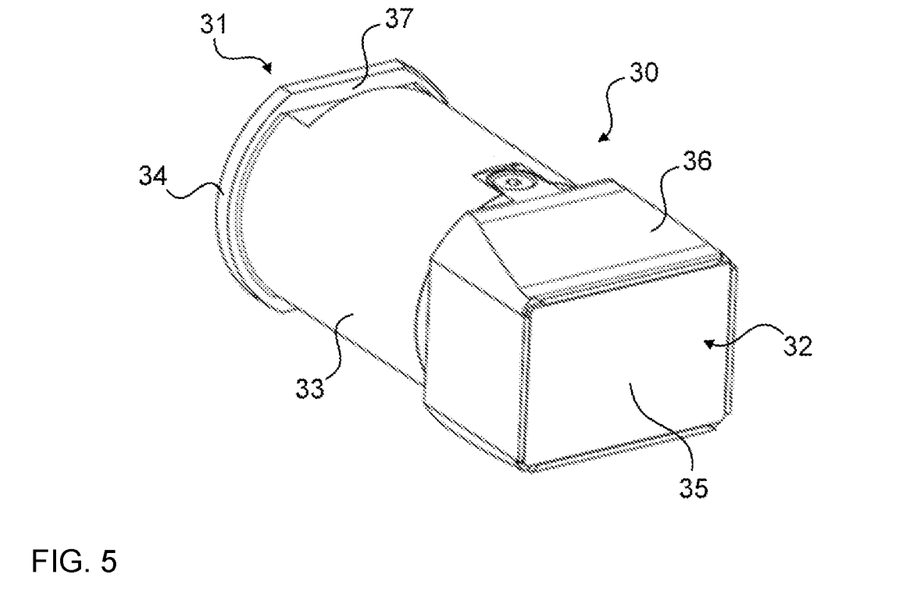
FIG. 5 schematically illustrates a perspective view of a detector head according to an embodiment.

Therein, the detector head 30, as shown in detail in FIG. 5, is of a length that corresponds to the distance between the SEM chamber port 50, particularly the mounting opening thereof, and a sample position, i.e., a position of a sample in the SEM chamber during Kikuchi measurements. The length of the detector head 30 is thereby formed by a hollow column 33 and a screen holder 36 attached thereto. Particularly, the hollow column 33 comprises a first terminal end 31 comprising the head mounting portion 34 configured for mounting the second body mounting portion 22 and a second terminal end 32 opposite the first terminal end. A screen holder 36 comprising a phosphor scintillation screen 35 is mounted to the second end of the hollow column via at least two screws. The screen holder 36 and the hollow column 33 can be advantageously stored separately. The head mounting portion 34 at the first terminal end 31 comprises at least two flange elements 37 that are configured to be mounted to the second body mounting portion 22 by sliding into reception elements 26.

Hence, the detector head 30 can be selectively mounted to the detector body 20 without using any additional screws or fastening means except those already mounted to the second body mounting portion 22. Hence, while the detector body 20 can be permanently mounted to an SEM, the detector head 30 is only mounted to the detector body 30 when Kikuchi diffraction measurements are actually performed. Thus, the SEM chamber can be freed for other kinds of measurements otherwise which improves versatility of the table top SEM.

Figure 6:
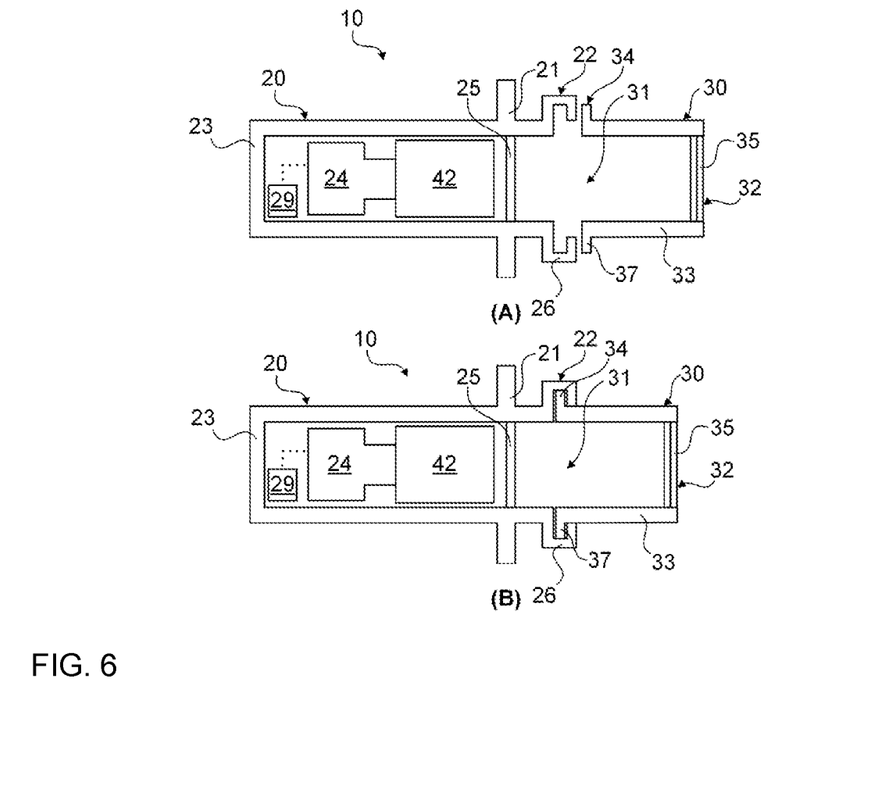
FIG. 6 schematically illustrates a cross section of a detector according to a first embodiment.

FIGS. 6 to 10 schematically illustrate cross sections of detectors 10 according to a several embodiments. A detector 10 according to a first embodiment is shown in FIG. 6 in (A) a detached state and (B) an attached state of detector body 20 and detector head 30.

According to this first embodiment of FIG. 6, the detector body 20 comprises a plastic body part enclosing the photodetector 24 and an objective lens 42. Therein, the objective lens 42 is arranged upstream the photodetector 24 with respect to the propagation direction of incident radiation. The detector body 20 further comprises control electronics 29 connected at least to the photodetector 24 for controlling the photodetector 24. The control electronics 29 are preferably configured to communicate with a computer, e.g., via a USB connection. Also, the control electronics 29 of the detector 10 communicates with a control unit of a SEM.

The detector body 20 further comprises a first body mounting portion 21 with a first mounting flange extending laterally from the detector body 20. The detector body 20 further comprises the second body mounting portion 22 also extending laterally from the detector body 20 with an extension that is less than that of the first body mounting portion 21. From the second body mounting portion, reception elements 26 protrude to form guiding grooves. A vacuum window 25 is disposed in between the first body mounting portion 21 and the second body mounting portion 22 with respect to the propagation direction of incident radiation.

The detector 10 of the first embodiment further comprises a detector head 30. The detector head is basically formed by a hollow column 33 with a first terminal end 31 and a second terminal end 32 opposite the first terminal end 31. The first terminal end 31 comprises a head mounting portion 34 that is configured to be mounted to the second body mounting portion 22. Particularly, the head mounting portion 34 comprises flange elements 37 extending laterally from the hollow column 33 with an extension that is fit to the lateral extension of the guiding grooves formed by the reception elements 26 described above. The detector head 30 further comprises a scintillation screen 35 disposed at the second terminal end 32 of the detector head 30 and comprising a phosphor screen configured to radiate photons in response to incident scattered electrons. These radiated photons form the incident radiation for the photodetector 24 as described above for the detector body 20.

In a detached state (A), the detector head 30 is not mounted to the detector body 20. In this state, the detector body 20 is preferably mounted to an SEM chamber port as described e.g., with respect to FIG. 3. In the attached state (B), the detector head 30 is mounted to the detector body 20 by sliding the flange elements 37 of the head mounting portion 31 in the guiding grooves of the reception elements 26 of the second body mounting portion 22.

Figure 7:
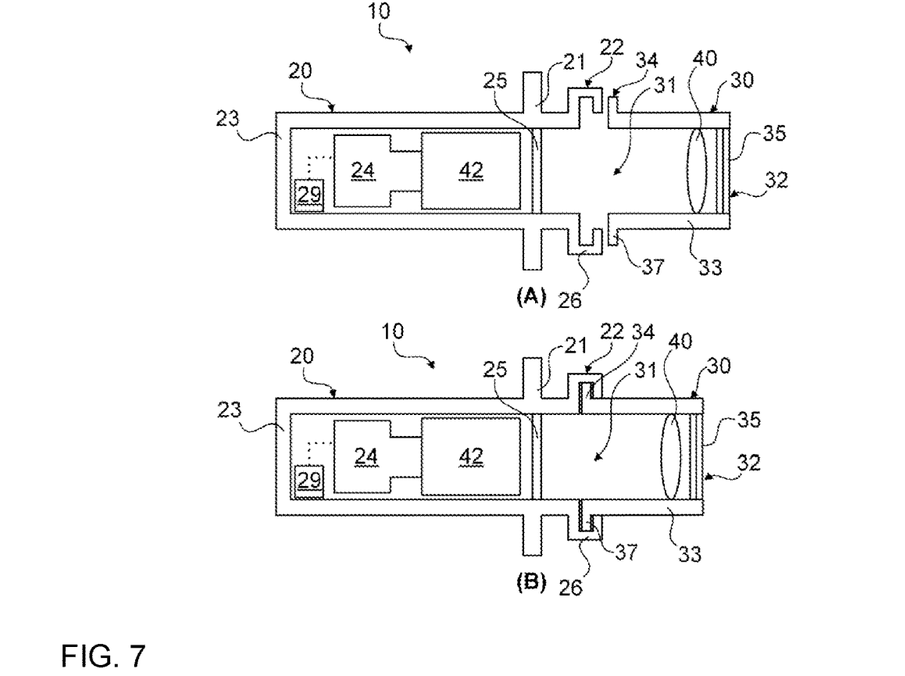
FIG. 7 schematically illustrates a cross section of a detector according to a second embodiment.
Figure 8:
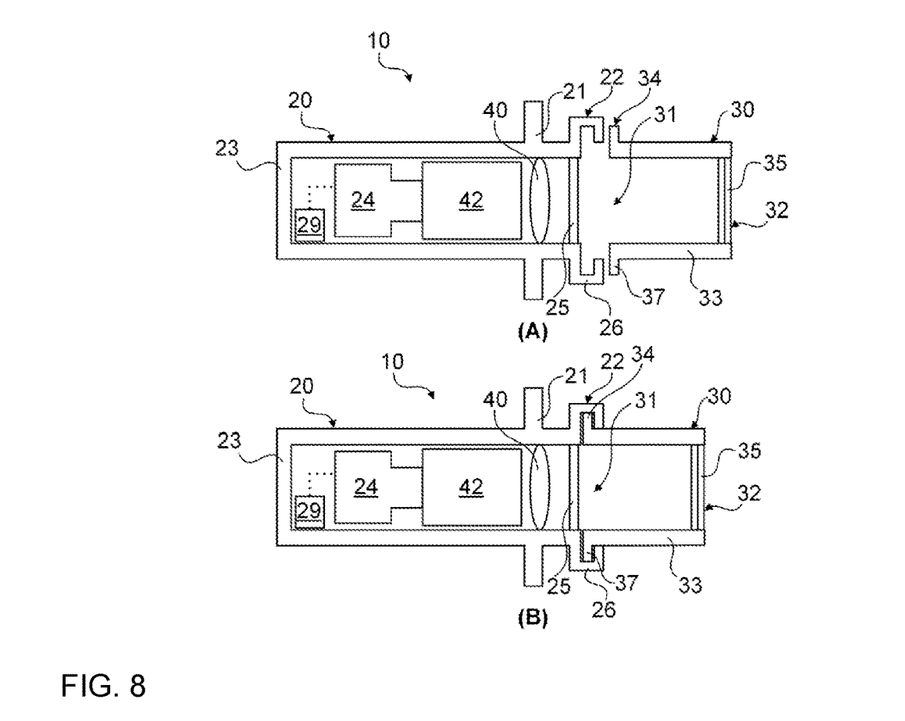
FIG. 8 schematically illustrates a cross section of a detector according to a third embodiment.

FIG. 7 schematically illustrates a cross section of a detector 10 according to a second embodiment. Therein, the detector 10 of the second embodiment differs from that of the first embodiment in that a macro lens 40 is disposed adjacent the scintillation screen 35 in the propagation direction of the incident radiation, i.e., with respect to the propagation direction of the photons emitted by the scintillation screen 35 and travelling to the photodetector 24. FIG. 8 schematically illustrates a cross section of a detector 10 according to a third embodiment that differs from that of the second embodiment in that the macro lens 40 is arranged in the detector body 20 instead of the detector head 30. Particularly, the macro lens 40 is arranged between the vacuum window 25 and the objective lens 42 and the photodetector 24.

Figure 9:
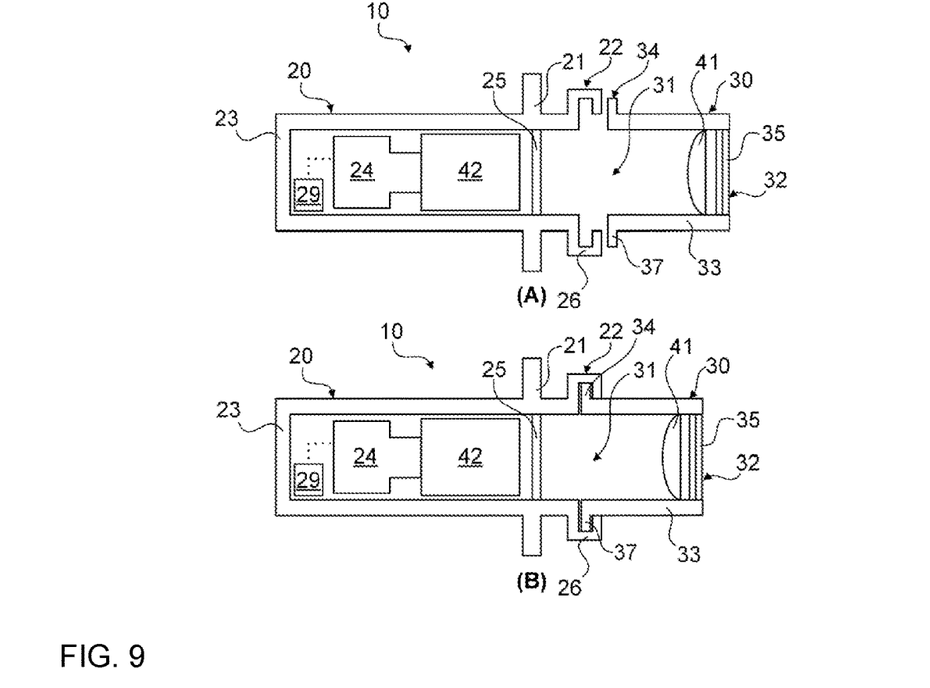
FIG. 9 schematically illustrates a cross section of a detector according to a fourth embodiment.

FIG. 9 schematically illustrates a cross section of a detector 10 according to a fourth embodiment. Therein, the detector 10 of the fourth embodiment differs from that of the first embodiment in that a field lens 41 is disposed adjacent the scintillation screen 35 of the detector head 30 in the propagation direction of the incident radiation, i.e., the photons emitted by the scintillation screen 35 in response to incident scattered electrons. The field lens 41 is configured with a high numerical aperture allowing to capture a high amount of the photons emitted by the scintillation screen 35 and to focus them on the downstream components of the detector's 10 optical system, particularly the objective lens 42.

Figure 10:
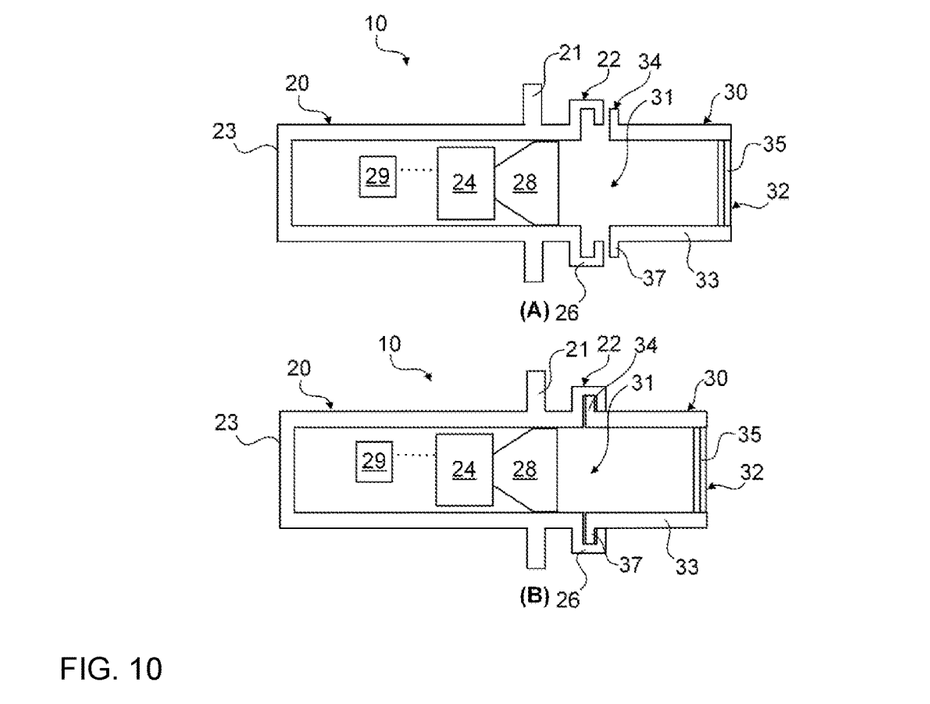
FIG. 10 schematically illustrates a cross section of a detector according to a fifth embodiment.

FIG. 10 schematically illustrates a cross section of a detector 10 according to a fifth embodiment. Therein, the detector 10 of the fifth embodiment differs from that of the first embodiment in that the detector body 20 comprises a fiber optical taper 28 instead of the objective lens 42 and the vacuum window 25. The fiber optical taper 28 is formed of a plurality of optical fibers that are coherently arranged connected to form a taper with a first base surface facing the detector head and a second base surface opposite the first base surface and facing the active surface of the photodetector 24. The fiber optical taper 28 is configured such that an image signal input to the first base surface is transmitted as a reduced image to the second base surface. Therein, the reduction is defined by a ratio of the first and second base surface. As can be seen in FIG. 10, the first base surface of the taper 28 is configured as vacuum window such that an additional vacuum window is omitted.

REFERENCE SIGNS 10 detector
20 detector body
21 first body mounting portion
22 second body mounting portion
23 body part
24 photodetector
25 vacuum window
26 reception elements
27 alignment elements
28 fiber optical taper
29 control electronics
30 detector head
31 first end
32 second end
33 hollow column
34 head mounting portion
35 scintillation screen
36 screen holder
37 flange elements
40 macro lens
41 field lens
42 objective lens
50 SEM chamber port

The invention claimed is:

1. Detector for Kikuchi diffraction, the detector comprising:
    a detector body and a detector head mountable to each other;
    the detector body comprising a body part enclosing a photodetector configured for detecting incident radiation; a vacuum window arranged upstream the photodetector with respect to a propagation direction of the incident radiation; and a first body mounting portion configured to be mounted to a SEM chamber port and a second body mounting portion, and
    the detector head comprising a scintillation screen and a head mounting portion configured to be mounted to the second body mounting portion, wherein
    the second body mounting portion is configured to be inserted through the SEM chamber port, before the first mounting portion is mounted to an outer side of the SEM chamber port.

2. Detector according to claim 1, wherein the first body mounting portion is disposed in between the second body mounting portion and the photodetector.

3. Detector according to claim 1, wherein the head mounting portion is configured to be mounted to the second body mounting portion from an inner side of a SEM chamber, when the second body mounting portion is inserted through and/or installed on the SEM chamber port.

4. Detector according to claim 1, wherein the detector head comprises a hollow column and wherein the head mounting portion is disposed at a first end of the hollow column and the scintillation screen is mounted to a second end of the hollow column opposite the first end.

5. Detector according to claim 4, wherein the length of the hollow column corresponds to a distance between the SEM chamber port and a sample position.

6. Detector according to claim 4, wherein the scintillation screen is mounted to a screen holder mounted to the hollow column of the detector head.

7. Detector according to claim 1, wherein the head mounting portion comprises at least one flange element and the second body mounting portion comprises at least one reception element configured for guiding, receiving and/or fastening the at least one flange element.

8. Detector according to claim 1, wherein the detector body, particularly the body part, further comprises an objective lens disposed between the vacuum window and the photodetector.

9. Detector according to claim 1, wherein the detector body, preferably the body part, comprises a fiber optical taper upstream the photodetector with respect to a propagation direction of the incident radiation.

10. Detector according to claim 1, wherein the detector head further comprises a field lens arranged adjacent the scintillation screen in a propagation direction of the incident radiation.

11. Detector according to claim 1, further comprising a macro lens adjacent the vacuum window or adjacent the scintillation screen in a propagation direction of the incident radiation.

12. Detector body for a detector according to claim 1, the detector body comprising:
    a body part enclosing a photodetector configured for detecting incident radiation;
    a vacuum window arranged upstream the photodetector with respect to a propagation direction of the incident radiation;

a first body mounting portion configured to be mounted to a SEM chamber port and a second body mounting portion configured to be mounted to a head mounting portion of a detector head.

13. Detector head for a detector according to claim 1, the detector head comprising:
a hollow column with a first end and a second end opposite the first end,
a head mounting portion disposed at the first end and configured to be mounted to a second body mounting portion of a detector body; and
a scintillation screen mounted to the second end.

14. Detection system for Kikuchi diffraction, comprising:
a scanning electron microscope, SEM, with a SEM chamber and at least one SEM chamber port for accessing the SEM chamber; and
a detector according to claim 1.

* * * * *